(12) United States Patent
Jeng et al.

(10) Patent No.: US 12,243,800 B2
(45) Date of Patent: Mar. 4, 2025

(54) PACKAGE STRUCTURE WITH LID AND METHOD FOR FORMING THE SAME

(71) Applicant: Taiwan Semiconductor Manufacturing Company, Ltd., Hsinchu (TW)

(72) Inventors: Shin-Puu Jeng, Hsinchu (TW); Po-Yao Lin, Zhudong Township, Hsinchu County (TW); Feng-Cheng Hsu, New Taipei (TW); Shuo-Mao Chen, New Taipei (TW); Chin-Hua Wang, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/415,801

(22) Filed: Jan. 18, 2024

(65) Prior Publication Data
US 2024/0153840 A1    May 9, 2024

Related U.S. Application Data

(60) Continuation of application No. 17/679,372, filed on Feb. 24, 2022, now Pat. No. 11,915,992, which is a division of application No. 16/182,750, filed on Nov. 7, 2018, now Pat. No. 11,264,300.

(60) Provisional application No. 62/732,010, filed on Sep. 17, 2018.

(51) Int. Cl.
| | |
|---|---|
| H01L 23/367 | (2006.01) |
| H01L 21/48 | (2006.01) |
| H01L 21/56 | (2006.01) |
| H01L 25/00 | (2006.01) |
| H01L 25/18 | (2023.01) |

(52) U.S. Cl.
CPC ...... H01L 23/3675 (2013.01); H01L 21/4871 (2013.01); H01L 21/56 (2013.01); H01L 25/18 (2013.01); H01L 25/50 (2013.01)

(58) Field of Classification Search
CPC . H01L 23/3675; H01L 21/4871; H01L 21/56; H01L 25/50; H01L 21/563
See application file for complete search history.

(56) References Cited

U.S. PATENT DOCUMENTS

| | | |
|---|---|---|
| 9,000,584 B2 | 4/2015 | Lin |
| 9,048,222 B2 | 6/2015 | Hung |
| 9,048,233 B2 | 6/2015 | Wu |
| 9,064,879 B2 | 6/2015 | Hung |
| 9,111,949 B2 | 8/2015 | Yu |
| 9,263,511 B2 | 2/2016 | Yu |
| 9,281,254 B2 | 3/2016 | Yu |

(Continued)

*Primary Examiner* — Shih Tsun A Chou
(74) *Attorney, Agent, or Firm* — McClure, Qualey & Rodack, LLP

(57) ABSTRACT

A method for forming a package structure is provided. The method includes disposing a semiconductor die over a carrier substrate, wherein a removable film is formed over the semiconductor die, disposing a first stacked die package structure over the carrier substrate, wherein a top surface of the removable film is higher than a top surface of the first stacked die package structure, and removing the removable film to expose a top surface of the semiconductor die, wherein a top surface of the semiconductor die is lower than the top surface of the first stacked die package structure.

20 Claims, 18 Drawing Sheets

(56) References Cited

U.S. PATENT DOCUMENTS

| | | |
|---|---|---|
| 9,368,460 B2 | 6/2016 | Yu |
| 9,372,206 B2 | 6/2016 | Wu |
| 9,443,830 B1* | 9/2016 | Axelowitz .......... H01L 23/5385 |
| 9,496,189 B2 | 11/2016 | Yu |
| 2004/0195667 A1 | 10/2004 | Karnezos |
| 2015/0035135 A1 | 2/2015 | Hung |
| 2015/0108628 A1 | 4/2015 | Yu |
| 2015/0155218 A1* | 6/2015 | Hung ................ H01L 23/49827 |
| | | 257/713 |
| 2015/0162307 A1* | 6/2015 | Chen ....................... H01L 21/56 |
| | | 438/107 |

\* cited by examiner

PACKAGE STRUCTURE WITH LID AND METHOD FOR FORMING THE SAME

CROSS REFERENCE TO RELATED APPLICATIONS

This application is a Continuation Application of U.S. patent application Ser. No. 17/679,372, filed on Feb. 24, 2022, which is a Divisional Application of U.S. patent application Ser. No. 11,264,300 B2, filed on Nov. 7, 2018, which claims priority to U.S. Provisional Application Ser. No. 62/732,010, filed on Sep. 17, 2018, the entirety of which are incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

New packaging technologies, such as package on package (PoP), have begun to be developed, in which a top package with a device die is bonded to a bottom package, with another device die. By adopting the new packaging technologies, various packages with different or similar functions are integrated together.

Although existing package structures and methods of fabricating package structure have generally been adequate for their intended purpose, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
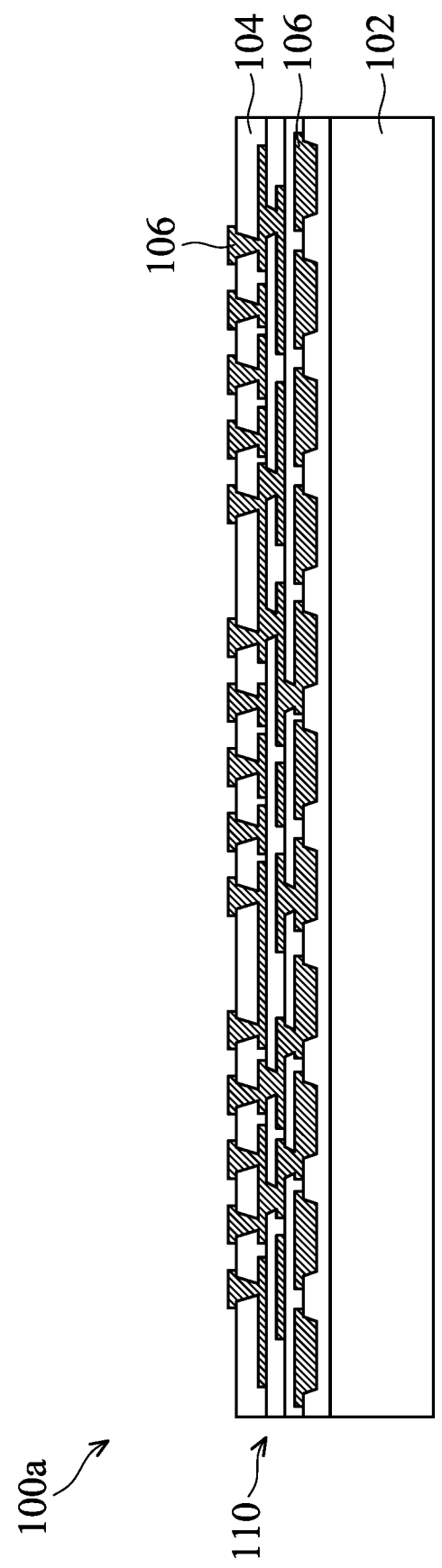
FIGS. 1A-1I show cross-sectional representations of various stages of forming a package structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments for a semiconductor device structure and method for forming the same are provided. FIGS. 1A-1I show cross-sectional representations of various stages of forming a package structure 100a, in accordance with some embodiments of the disclosure. The package structure may be a chip-on-wafer-on-substrate (CoWoS) package or another suitable package. A semiconductor die and a memory stacked die structure are formed over an interconnect structure, and a T-shaped lid structure is formed over the semiconductor die and the memory stacked die structure. The package structure is a fan-out package structure. The term of "fan-out" means that the I/O pads on a die can be redistributed to a greater area than the die itself, and hence the number of I/O pads packed on the surfaces of the dies can be increased.

Referring to FIG. 1A, a carrier substrate 102 is provided. The carrier substrate 102 is configured to provide temporary mechanical and structural support during subsequent processing steps, in accordance with some embodiments. The carrier substrate 102 includes glass, silicon oxide, aluminum oxide, metal, a combination thereof, and/or the like, in accordance with some embodiments. The carrier substrate 102 includes a metal frame, in accordance with some embodiments.

An interconnect structure 110 is formed over the carrier substrate 102. The interconnect structure 110 may be used as a redistribution (RDL) structure for routing. The interconnect structure 110 includes multiple dielectric layers 104 and multiple conductive layers 106. In some embodiments, some of the conductive layers 106 are exposed at or protruding from the top surface of the top of the dielectric layers 104. The exposed or protruding conductive layers 106 may serve as bonding pads where conductive bumps (such as tincontaining solder bumps) and/or conductive pillars (such as copper pillars) will be formed later.

The dielectric layers 104 may be made of or include one or more polymer materials. The polymer material(s) may include polybenzoxazole (PBO), polyimide (PI), one or more other suitable polymer materials, or a combination thereof. In some embodiments, the polymer material is photosensitive. In some embodiments, some or all of the dielectric layers 104 are made of or include dielectric materials other than polymer materials. The dielectric material may include silicon oxide, silicon carbide, silicon nitride, silicon oxynitride, one or more other suitable materials, or a combination thereof.

Figure 1B:
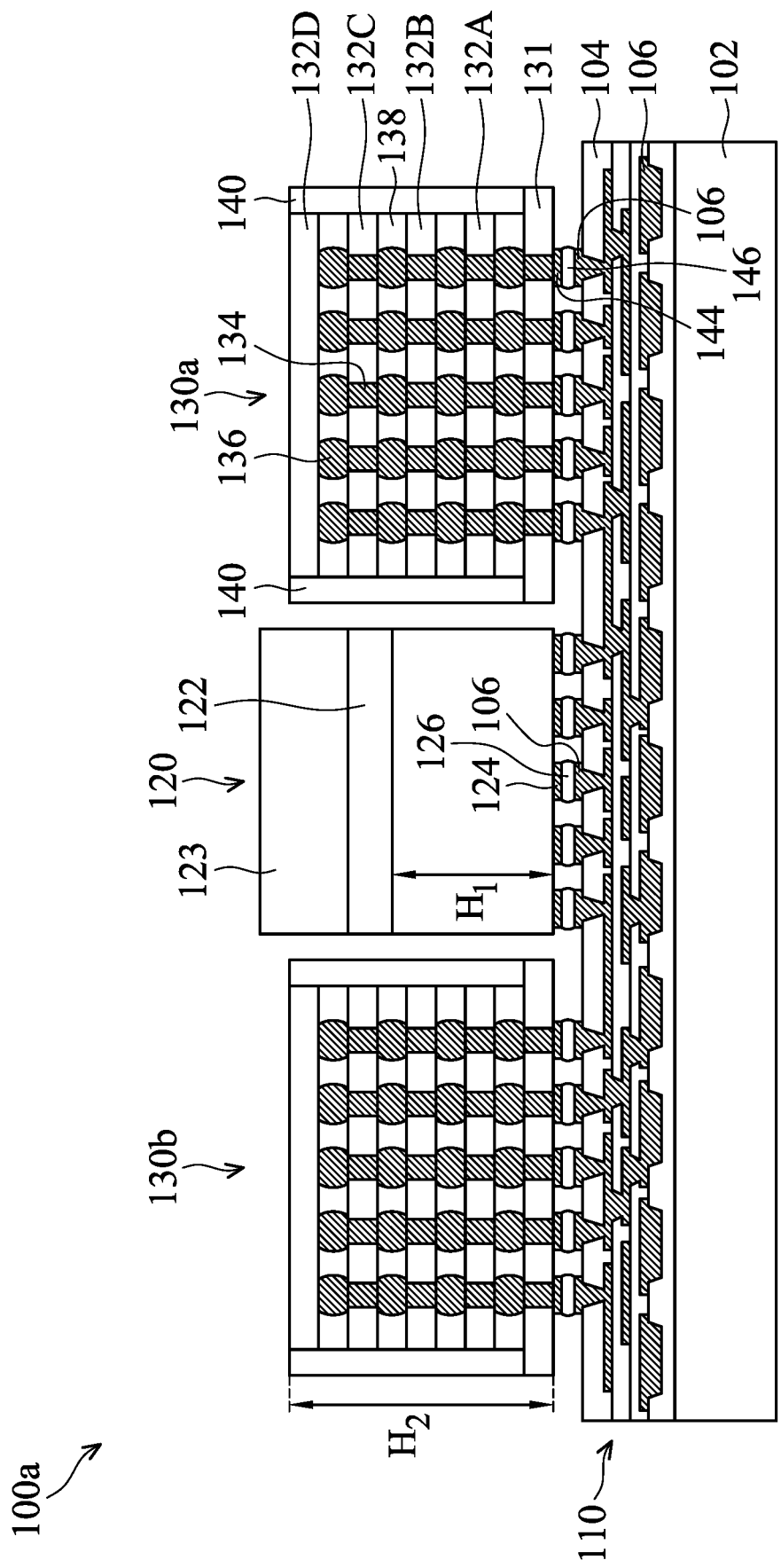

Afterwards, as shown in FIG. 1B, a semiconductor die 120, a first stacked die package structure 130a and a second stacked die package structure 130b are formed over the carrier substrate 102, in accordance with some embodiments of the disclosure. The semiconductor die 120 is between the first stacked die package structure 130a and the second stacked die package structure 130b.

In some embodiments, a semiconductor die 120 is disposed over the carrier substrate 102. The semiconductor die 120 is sawed from a wafer, and may be a "known-good-die". The semiconductor die 120 may be a system-on-chip (SoC) chip. In some other embodiments, the semiconductor die 120 is a system on integrated circuit (SoIC) device that includes two or more chips with integrated function.

The semiconductor die 120 is disposed over the interconnection structure 110. The semiconductor die 120 has a substrate 122, and a removable film 123 is formed over the substrate 122. The top surface of the removable film 123 is higher than the top surface of the first stacked die package structure 130a and the top surface of the second stacked die package structure 130b.

In some embodiments, the substrate 122 is silicon (Si) substrate. The removable film 123 is used as a release film and will be removed in the following process. In some embodiments, the removable film 123 is made of grindable and low out-gassing materials. In some embodiments, the removable film 123 is made of thermoplastic material, such as polyethylene (PE), polypropylene (PP), polyethyleneterephthalate (PET) or another applicable material.

In some embodiments, a number of conductive pads 124 are formed below the semiconductor die 120, and each of the conductive pads 124 is bonded to the conductive layer 106 of the interconnect structure 110 through a conductive connector 126. The conductive pads 124 are made of metal materials, such as copper (Cu), copper alloy, aluminum (Al), aluminum alloy, tungsten (W), tungsten alloy, titanium (Ti), titanium alloy, tantalum (Ta) or tantalum alloy. In some embodiments, the conductive pad 124 is formed by an electroplating, electroless plating, printing, chemical vapor deposition (CVD) process or physical vapor deposition (PVD) process. The conductive connector 126 is made of solder materials, such as tin (Sn), SnAg, SnPb, SnAgCu, SnAgZn, SnZn, SnBiIn, SnIn, SnAu, SnPb, SnCu, SnZnIn, SnAgSb or another applicable material. In some embodiments, the conductive connector 126 is formed by electroplating, electroless plating, printing, chemical vapor deposition (CVD) process or physical vapor deposition (PVD) process.

The first stacked die package structure 130a and the second stacked die package structure 130b are disposed over the interconnect structure 110. The first stacked die package structure 130a and the second stacked die package structure 130b are at opposite sides of the semiconductor die 120. Each of the first stacked die package structure 130a and the second stacked die package structure 130b includes a number of semiconductor dies 132A, 132B, 132C, 132D. In some embodiments, the semiconductor dies 132A, 132B, 132C, 132D are memory dies. The semiconductor die 120 has a different function from each of the plurality of the memory dies. The memory dies may include static random access memory (SRAM) devices, dynamic random access memory (DRAM) devices, high bandwidth memory (HBM) or another memory dies. The number of the semiconductor dies 132A, 132B, 132C, 132D are not limited to four, and the number can be adjusted according to the actual application.

The semiconductor dies 132A, 132B, 132C, 132D are stacked on a buffer die (or base die) 131 that performs as a logic circuit. The semiconductor dies 132A, 132B, 132C, 132D are bonded to each other by a number of bonding structures 136. A number of through substrate vias (TSVs) 134 are formed in the semiconductor dies 132A, 132B, 132C, 132D. The signal between the semiconductor dies 132A, 132B, 132C, 132D may be transferred through the through substrate vias (TSVs) 134 and the bonding structures 136.

An underfill layer 138 is formed between the semiconductor dies 132A, 132B, 132C, 132D to protect the bonding structures 136. In some embodiments, the underfill layer 138 includes an epoxy-based resin with fillers dispersed therein. The fillers may include insulating fibers, insulating particles, other suitable elements, or a combination thereof. A molding compound 140 protects the semiconductor dies 132A, 132B, 132C, 132D. In some embodiments, the molding compound 140 may include an epoxy-based resin with fillers dispersed therein. The fillers may include insulating fibers, insulating particles, other suitable elements, or a combination thereof. In some embodiments, the size and/or density of the fillers dispersed in the underfill layer 138 is smaller than those dispersed in the molding compound 140.

In some embodiments, a number of conductive pads 144 are formed on the first stacked die package structure 130a and the second stacked die package structure 130b, and each of the conductive pads 144 is bonded to the conductive layer 106 of the interconnect structure 110 through a conductive connector 146.

The conductive pads 144 are made of metal materials, such as copper (Cu), copper alloy, aluminum (Al), aluminum alloy, tungsten (W), tungsten alloy, titanium (Ti), titanium alloy, tantalum (Ta) or tantalum alloy. In some embodiments, the conductive pad 144 is formed by an electroplating, electroless plating, printing, chemical vapor deposition (CVD) process or physical vapor deposition (PVD) process.

The conductive connector 146 is made of solder materials, such as tin (Sn), SnAg, SnPb, SnAgCu, SnAgZn, SnZn, SnBiIn, SnIn, SnAu, SnPb, SnCu, SnZnIn, SnAgSb or another applicable material. In some embodiments, the conductive connector 146 is formed by electroplating, electroless plating, printing, chemical vapor deposition (CVD) process or physical vapor deposition (PVD) process.

The semiconductor die 120 has a first height $H_1$ along a vertical direction, and the first stacked die package structure 130a has a second height $H_2$ along the vertical direction. The second height $H_2$ is greater than the first height $H_1$. In some embodiments, the first height $H_1$ of the semiconductor die 120 is in a range from about 750 μm to about 850 μm. In some embodiments, the second height $H_2$ of the first stacked die package structure 130a in a range from about 900 μm to about 1000 μm.

In some embodiments, a height difference ($\Delta H = H_2 - H_1$) between the second height and the first height $H_1$ is in a range from about 50 μm to about 150 μm. When the height difference is within above-mentioned range, the package structure 100a have a good heat dissipation efficiency.

Furthermore, since the first stacked die package structure 130a includes multiple semiconductor dies 132A, 132B, 132C, 132D, the height of each of the semiconductor dies 132A, 132B, 132C, 132D is smaller than the first height $H_1$ of the semiconductor die 120.

Figure 1C:
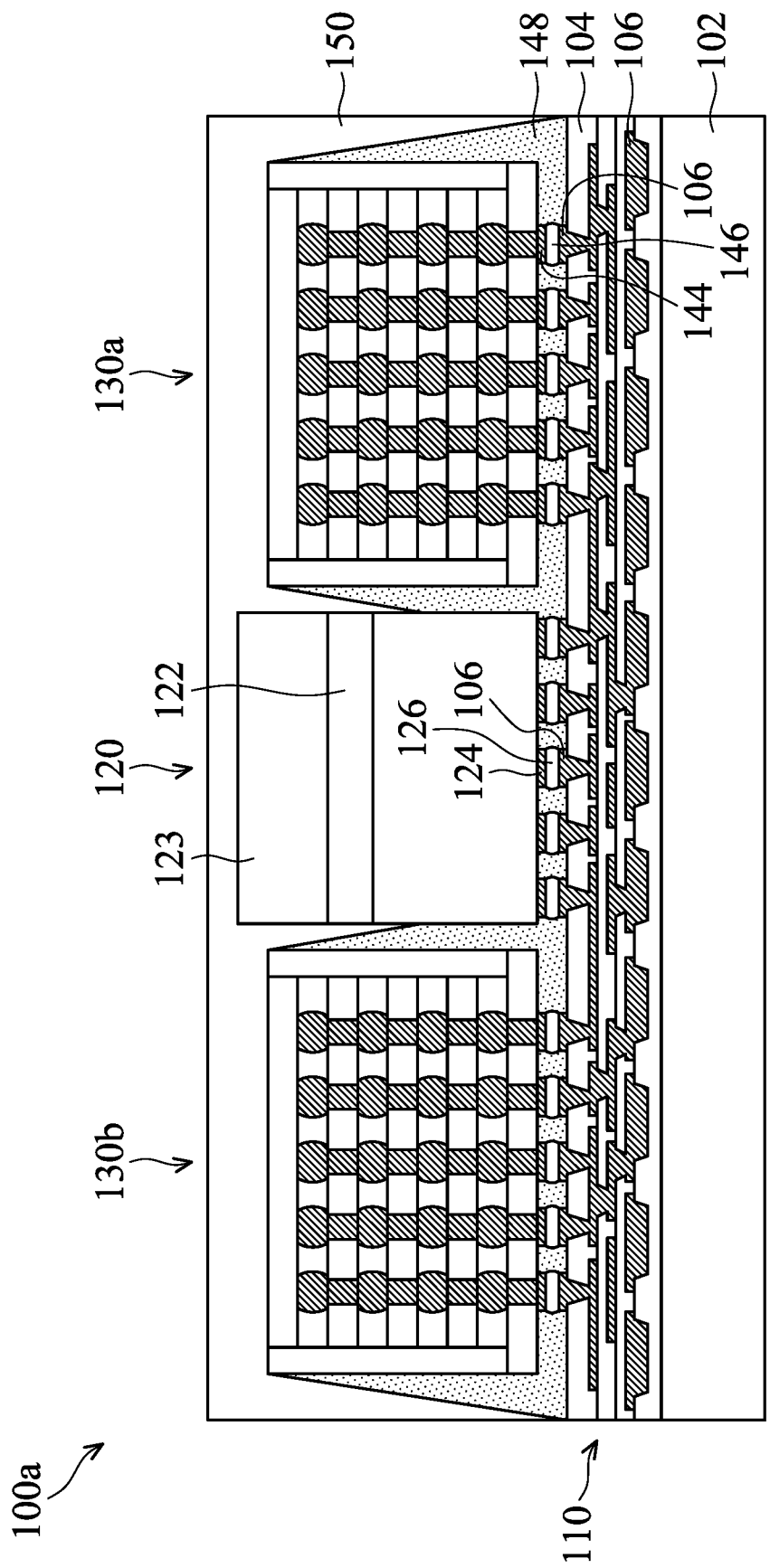

Afterwards, as shown in FIG. 1C, an underfill layer 148 is formed between the semiconductor die 120, the first stacked die package structure 130a, the second stacked die package structure 130b, and the interconnect structure 110, in accordance with some embodiments of the disclosure. The underfill layer 148 surrounds and protects the conductive connectors 126 and 146. In some embodiments, the underfill layer 148 is in direct contact with the conductive connectors 126 and 146.

In some embodiments, the underfill layer 148 is made of or includes a polymer material. The underfill layer 148 may include an epoxy-based resin. In some embodiments, the underfill layer 148 includes fillers dispersed in the epoxy-based resin.

In some embodiments, the formation of the underfill layer 148 involves an injecting process, a spin-on process, a dispensing process, a film lamination process, an application process, one or more other applicable processes, or a combination thereof. In some embodiments, a thermal curing process is used during the formation of the underfill layer 148.

Afterwards, a package layer 150 is formed over the underfill layer 148. The package layer 150 is also formed over the removable film 123. There is an interface between the underfill layer 148 and the package layer 150, and the interface is lower than the top surface of the semiconductor die 120.

The package layer 150 surrounds and protects the semiconductor die 120, the first stacked die package structure 130a and the second stacked die package structure 130b. In some embodiments, the package layer 150 is in direct contact with a portion of the semiconductor die 120, a portion of the first stacked die package structure 130a and a portion of the second stacked die package structure 130b.

The package layer 150 is made of a molding compound material. The molding compound material may include a polymer material, such as an epoxy-based resin with fillers dispersed therein. In some embodiments, a liquid molding compound material is applied over the semiconductor die 120, the first stacked die package structure 130a and the second stacked die package structure 130b. The liquid molding compound material may flow into a space between the semiconductor die 120, the first stacked die package structure 130a and the second stacked die package structure 130b. A thermal process is then used to cure the liquid molding compound material and to transform it into the package layer 150.

Figure 1D:
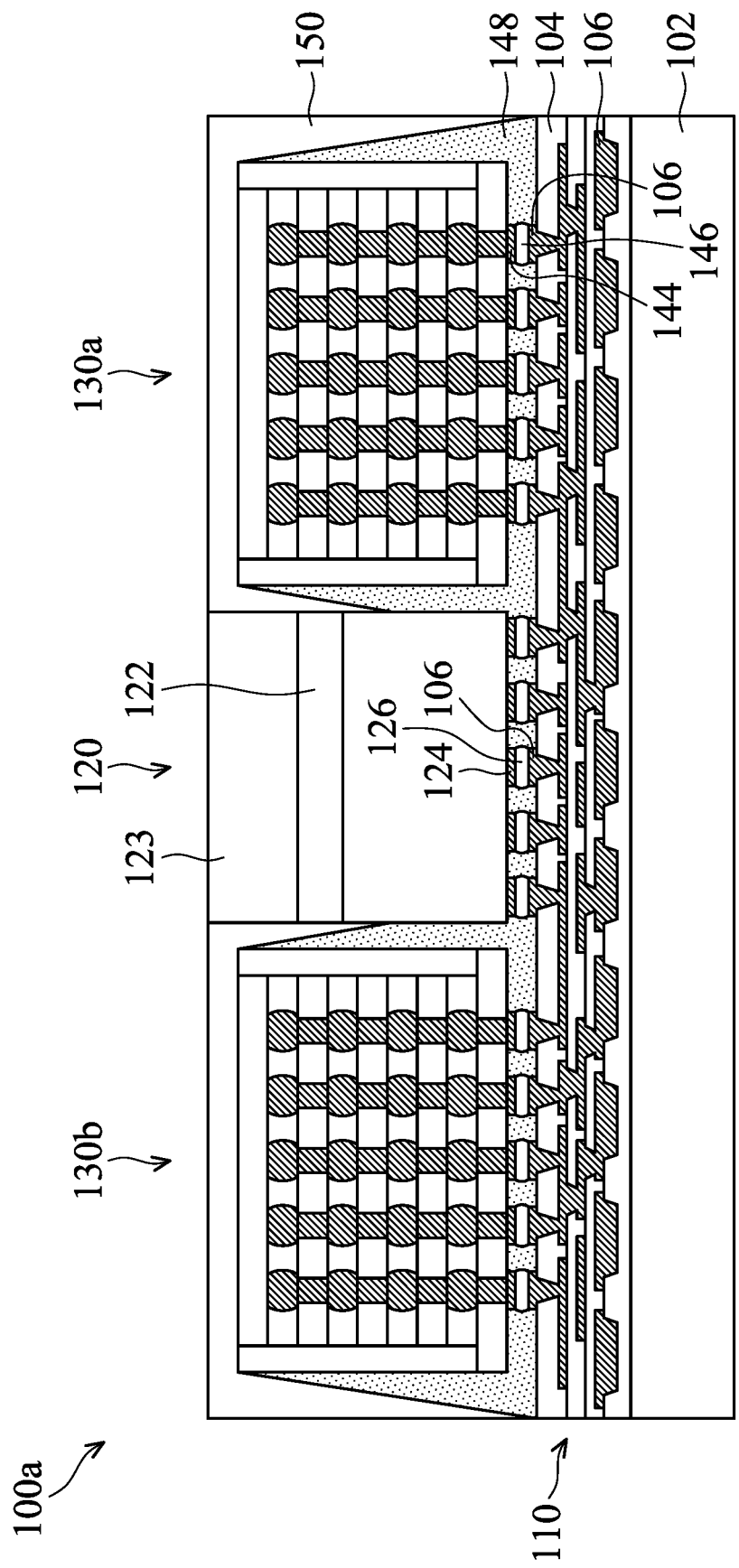

Afterwards, as shown in FIG. 1D, a portion of the removable film 123 is removed to expose the top surface of the removable film 123, in accordance with some embodiments of the disclosure. In some embodiments, the portion of the removable film 123 is removed by a planarization process, such as a chemical mechanical polishing (CMP) process. In addition, since the first stacked die package structure 130a and the second stacked die package structure 130b are protected by the package layer 150, the top surface of the first stacked die package structure 130a and the top surface of the second stacked die package structure 130b are not exposed by the CMP process.

Figure 1E:
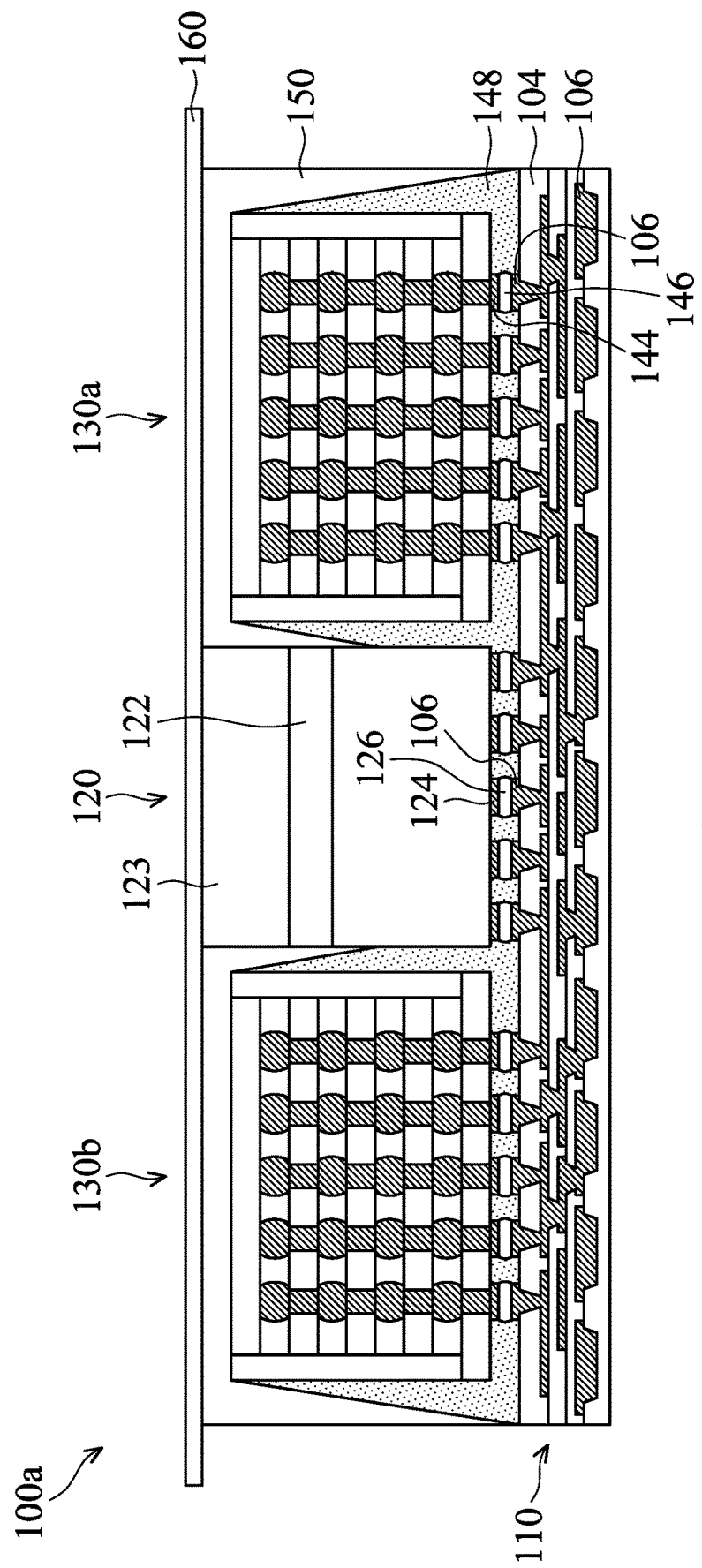

Afterwards, as shown in FIG. 1E, a frame tape 160 is formed over the removable film 123 and the package layer 150, in accordance with some embodiments of the disclosure. Afterwards, the carrier substrate 102 is removed.

The frame tape 160 is used as a temporary substrate. The frame tape 160 substrate provides mechanical and structural support during subsequent processing steps, such as those described in more detail later. In some embodiments, the removable film 123 and the first stacked die package structure 130a are adhered to the frame tape 160. For example, the removable film 123 and the package layer 150 are attached to the frame tape 160 through an adhesive layer (not shown). The adhesive layer is used as a temporary adhesive layer.

Figure 1F:
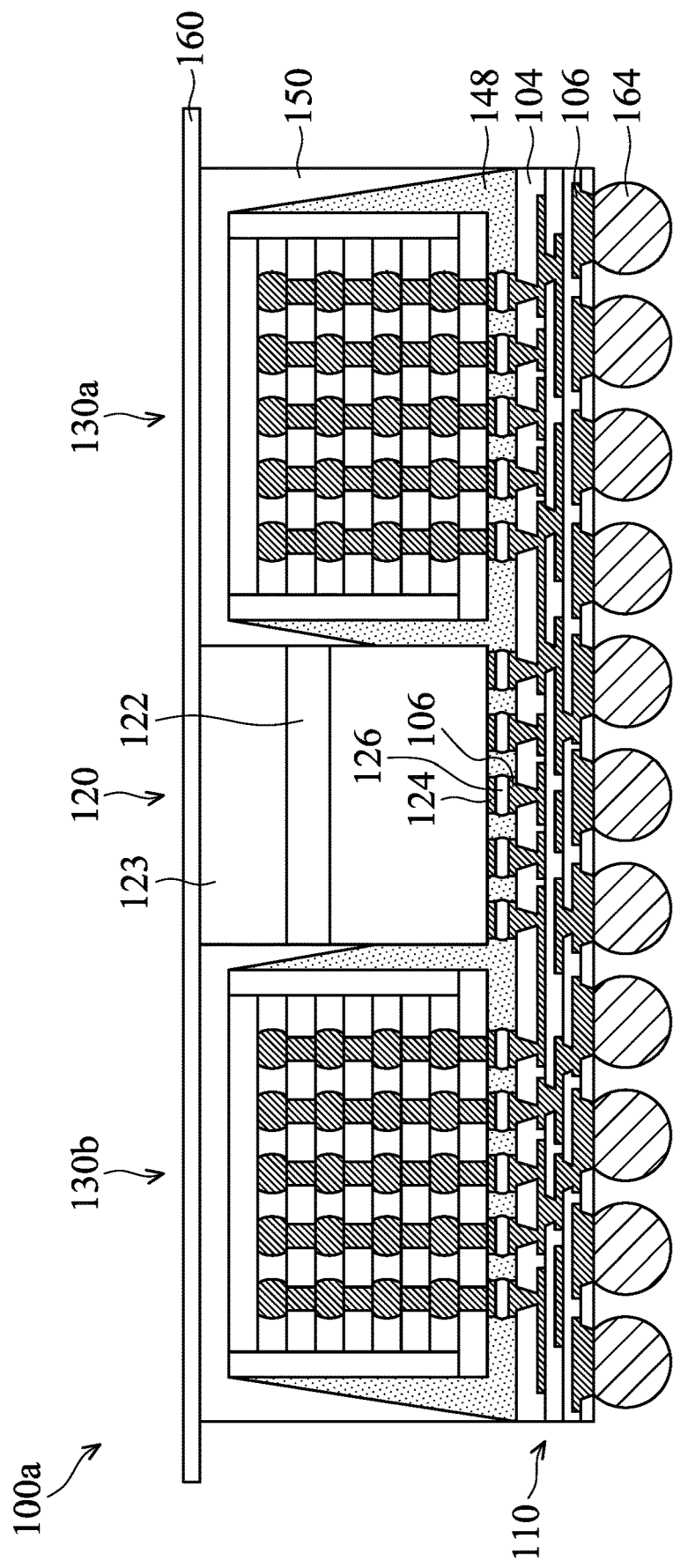

Next, as shown in FIG. 1F, a portion of the interconnect structure 110 is removed, in accordance with some embodiments of the disclosure. As a result, the conductive layer 106 of the interconnect structure 110 is exposed.

Afterwards, a number of the conductive connectors 164 are formed over the exposed conductive layer 106 of the interconnect structure 110. The conductive connectors 164 are electrically connected to the conductive layer 106 of the interconnect structure 110. In some embodiments, the conductive connectors 164 are referred to as controlled collapse chip connection (C4) bumps. In some other embodiments, the conductive connectors 164 is micro bumps, electroless nickel-electroless palladium-immersion gold technique (ENEPIG) formed bumps, ball grid array (BGA) bumps, or the like.

It should be noted that the conductive connectors 126 are formed on the top surface of the interconnect structure 110, and the conductive connectors 164 are formed on the bottom surface of the interconnect structure 110. There is a first gap between two adjacent conductive connectors 126, and a second gap between two adjacent conductive connectors 164. The second gap is greater than the first gap. Accordingly, the interconnect structure 110 enables the fan-out connection.

Subsequently, a singulation process is performed to separate the wafer-level package structure 100a into multiple die-level package structure 100a. In some embodiments, the singulation process is a dicing process.

Figure 1G:
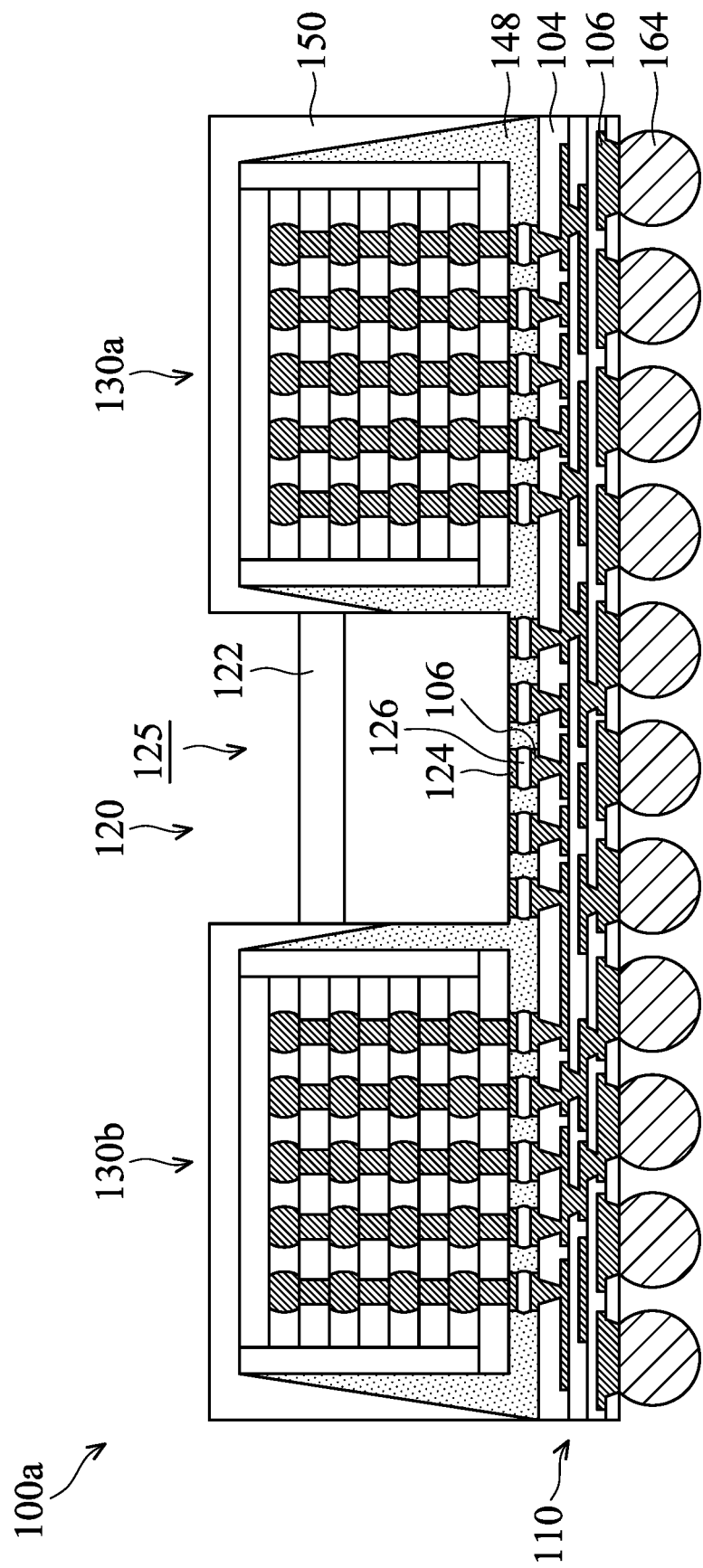

Next, as shown in FIG. 1G, the frame tape 160 is removed, and then the removable film 123 is removed, in accordance with some embodiments of the disclosure. As a result, a recess 125 is formed over the top surface of the semiconductor die 120. The entirety top surface of the semiconductor die 120 is exposed. The package layer 150 is exposed by the sidewall surface of the recess 125. In some embodiments, the removable film 123 is removed by an etching process. For example, the removable film 123 is removed by a wet etching process, such as an acid solution.

Figure 1H:
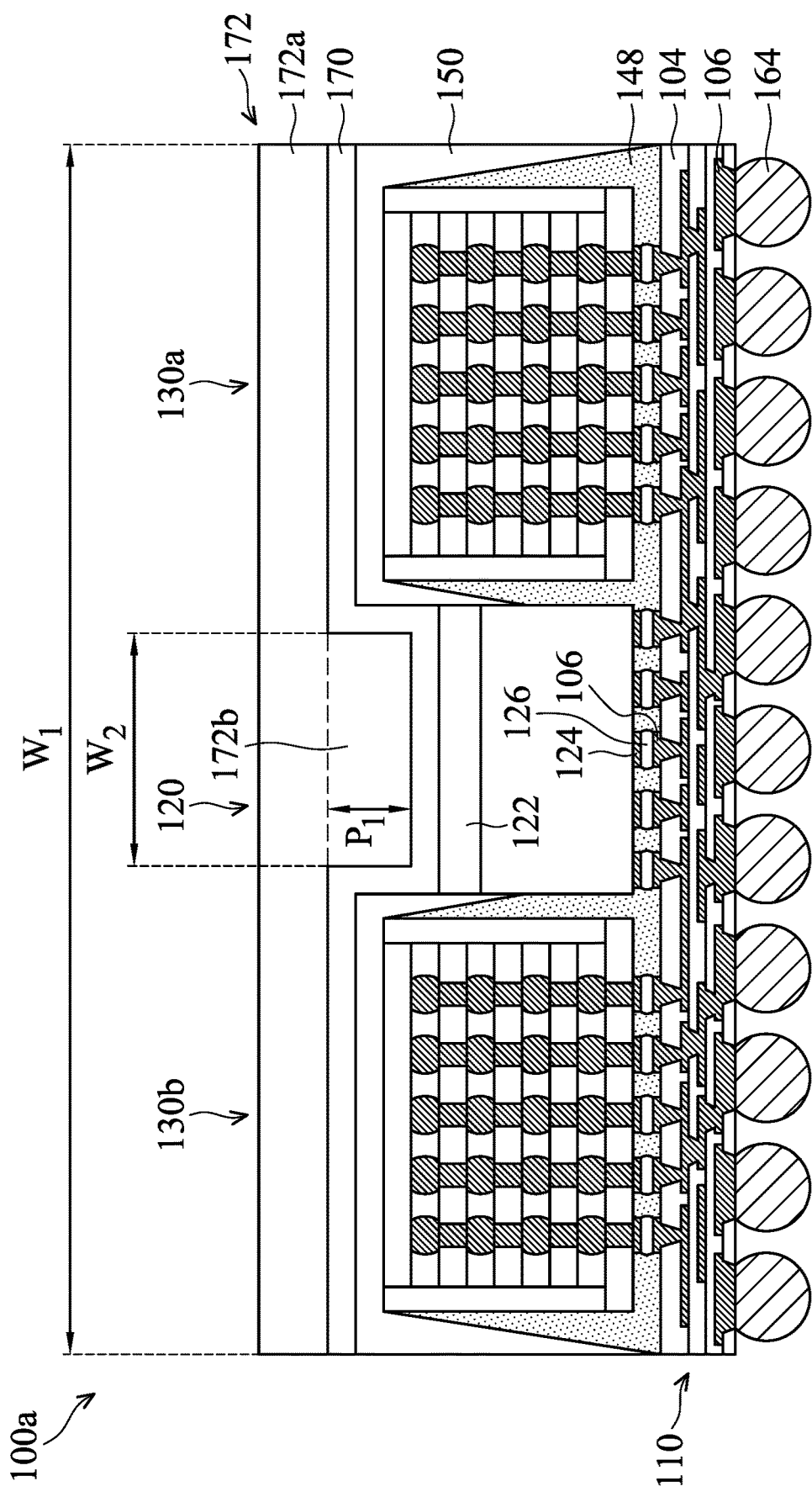

Subsequently, as shown in FIG. 1H, an adhesive layer 170 is formed over the semiconductor die 120 and the package layer 150, in accordance with some embodiments of the disclosure.

The adhesive layer 170 is conformally formed in the recess 125, and over the semiconductor die 120 and the package layer 150. Therefore, the adhesive layer 170 includes a top portion directly over the first stacked die package structure 130a and the second stacked die package structure 130b and a bottom portion directly over the semiconductor die 120. The sidewall surface of the bottom portion of the adhesive layer 170 is substantially aligned with the sidewall surface of the semiconductor die 120. In addition, the bottom portion of the adhesive layer 170 is lower than the top surface of the first stacked die package structure 130a. In other words, the bottommost surface of the adhesive layer 170 is lower than the top surface of the first stacked die package structure 130a.

The adhesive layer 170 is made of polymer having a good thermal conductivity. In some embodiments, the adhesive layer 170 includes thermal interface material (TIM).

Next, a lid structure 172 is formed over the adhesive layer 170. Accordingly, the heat generated from the semiconductor die 120, the first stacked die package structure 130a and the second stacked die package structure 130b may dissipate to the lid structure 172, and then dissipate to the external environment. In some embodiments, a bottommost surface of the lid structure 172 is lower than the top surface of the first stacked die package structure 130a.

The lid structure 172 has a main portion 172a and a protruding portion 172b extending from the main portion 172a. In some embodiments, the lid structure 172 has a T-shaped structure. The dashed line shown in FIG. 1H is used to define the profile of the main portion 172a and the protruding portion 172b of the lid structure 172. There is no real interface between the main portion 172a and the protruding portion 172b. The main portion 172a has a rectangular shape, and the protruding portion 172b also has a rectangular shape. The size of the main portion 172a is greater than that of the protruding portion 172b.

Since the recess 125 is not completely filled with the adhesive layer 170, the remaining recess 125 is filled with the lid structure 172. The protruding portion 172b of the lid structure 170 is directly over the semiconductor die 120.

The protruding portion 172b of the lid structure 172 has a bottom surface, the bottom surface of the protruding portion 172b is higher than a top surface of the semiconductor die 120 and lower than the top surface of the first stacked die package structure 130a and the top surface of the second stacked die package structure 130b.

The lid structure has a top surface with a top width $W_1$ and a bottom surface with a bottom width $W_2$. The top width $W_1$ is greater than the bottom width $W_2$. The protruding portion 172b has a protruding height $P_1$. In some embodiments, the protruding height $P_1$ is in a range from about 50 □m to about 150 □m.

Figure 1I:
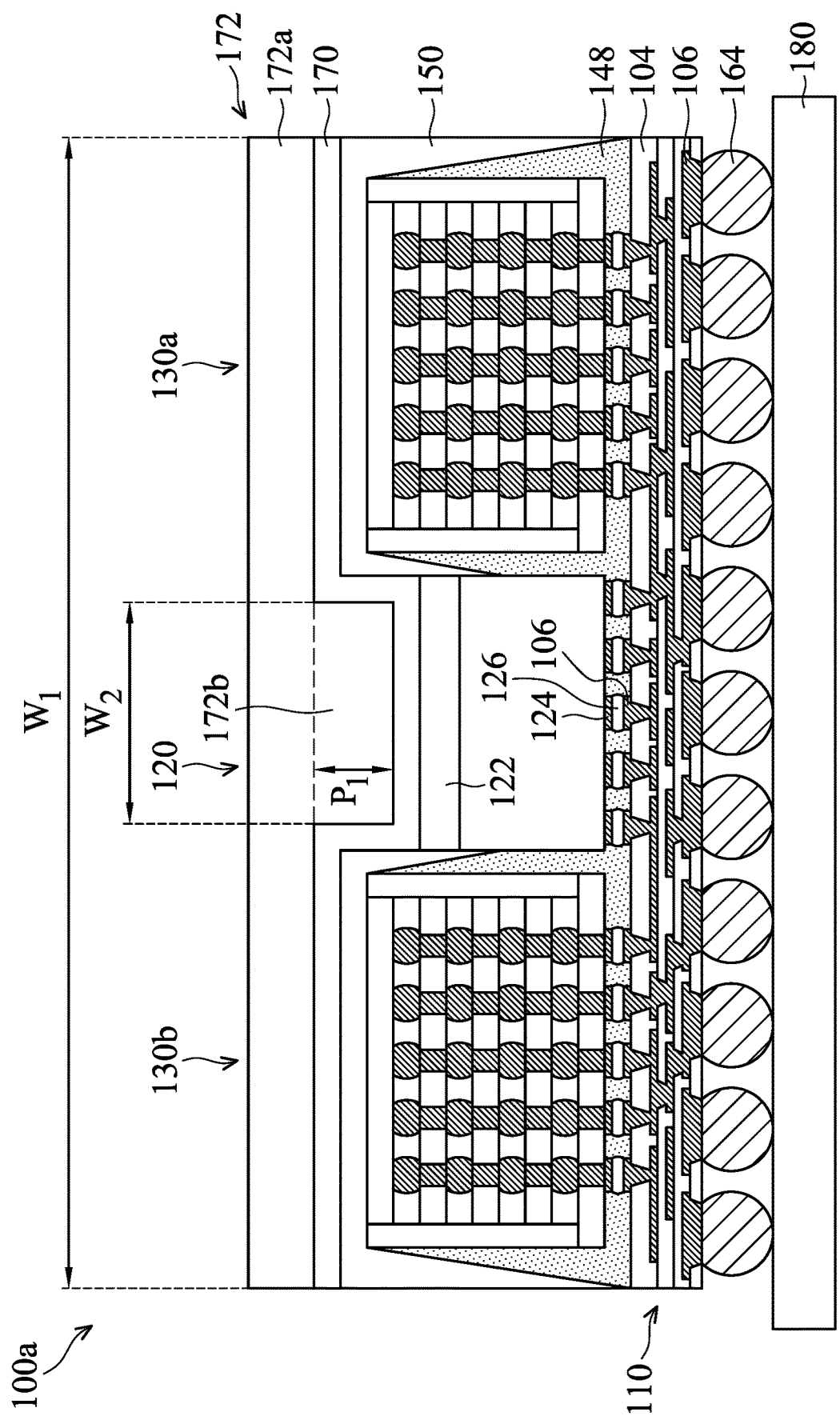

Afterwards, as shown in FIG. 1I, the package structure 100a is bonded to a package substrate 180 through the conductive connectors 164, in accordance with some embodiments. In some embodiments, the package substrate 180 is a printed circuit board (PCB), a ceramic substrate or another suitable package substrate. The interconnect structure 110 is used as fan out electrical connection to connect the signals of the semiconductor die 120, the first stacked die package structure 130a and the second stacked die package structure 130b to the package substrate 180.

In the first embodiment, the first stacked die package structure 130a and the second stacked die package structure 130b are covered by the package layer 150 and not removed during removing a portion of the removable film 123. The semiconductor dies 132A, 132B, 132C and 132D in the first stacked die package structure 130a and the second stacked die package structure 130b are not damaged during the planarization process. The semiconductor dies 132A, 132B, 132C and 132D respectively have different functions, and they are not damaged to maintain their function. Therefore, the quality and reliability of the first stacked die package structure 130a and the second stacked die package structure 130b are improved.

As the requirement for the memory capacity of the first stacked die package structure 130a is gradually increased, the number of the semiconductor dies 132A, 132B, 132C, 132D is increased. Accordingly, the first stacked die package structure 130a is higher than the semiconductor die 120, and a gap is between the semiconductor die 120 and the first stacked die package structure 130a. In order to provide high heat dissipation, the lid structure 172 is designed to have a protruding portion to insert into the gap between the semiconductor die 120 and the first stacked die package structure 130a.

In some other embodiments, if a planar lid structure is disposed over the semiconductor die 120 and the first stacked die package structure 130a, the adhesive layer 170 will be thick to compensate the height difference between the semiconductor die 120 and the first stacked die package structure 130a. However, the heat transfer coefficient (k) of the adhesive layer 170 is relatively smaller than that of the lid structure 172. The thick adhesive layer 170 directly over the semiconductor die 120 will degrade the heat dissipation. The lid structure 172 having the protruding portion 172b, rather than thick adhesive layer 170, is used to fill the height difference generated from the semiconductor die 120 and the first stacked die package structure 130a. The lid structure 172 provides high heat dissipation efficiency, and therefore, the performance of the of the package structure 100a is improved.

In addition, the semiconductor die 120 and the first stacked die package structure 130a are directly formed on the interconnect structure 110 (or called as redistribution layer (RDL)), and they are electrically connected to the package substrate 180 through the interconnect structure without using additional interposer structure. Therefore, the fan-out package structure 100a is obtained and the fabrication time and cost are reduced.

Figure 2:
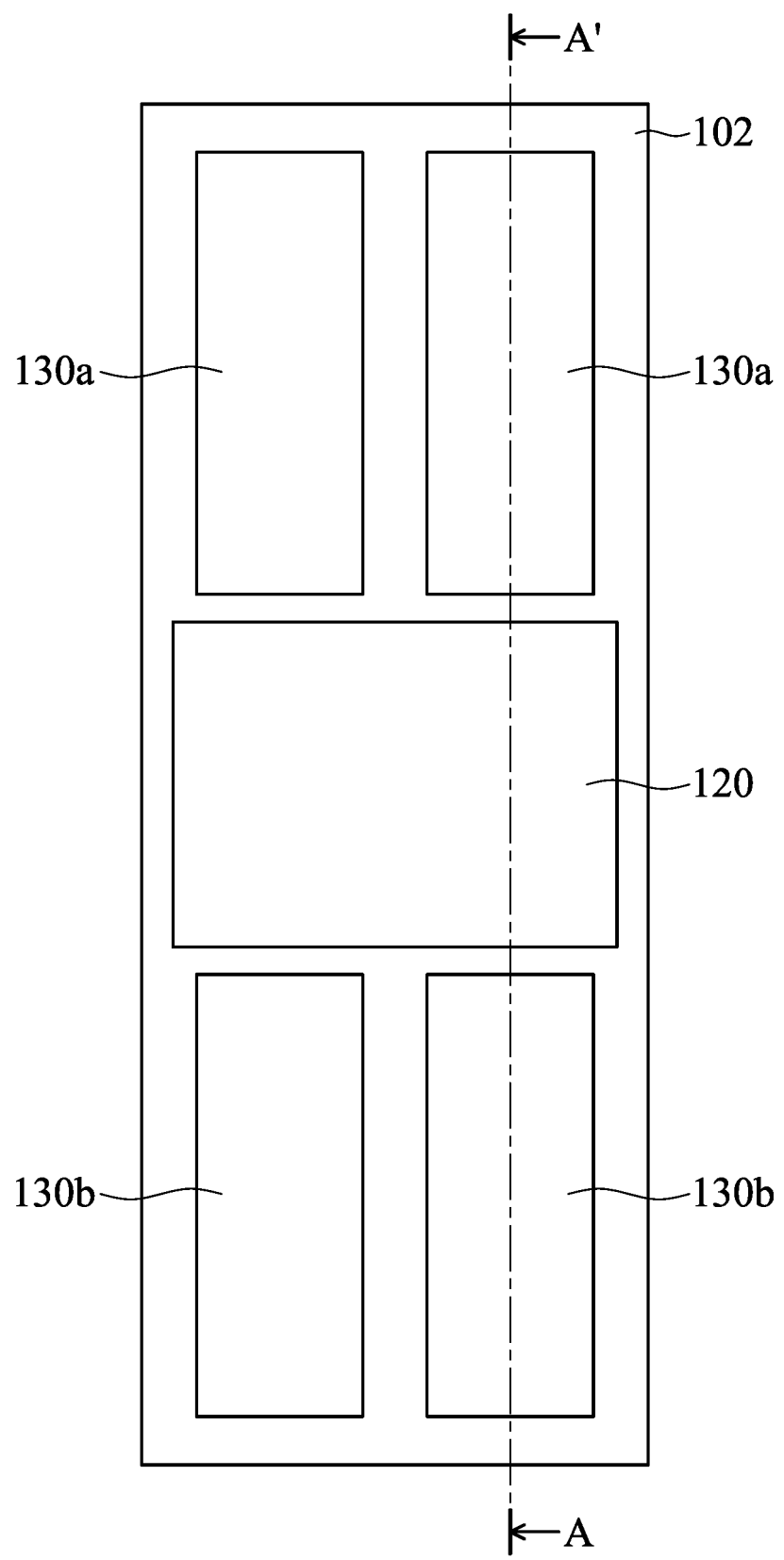
FIG. 2 shows a top-view representation of the package structure, in accordance with some embodiments of the disclosure.

FIG. 2 shows a top-view representation of the package structure 100a, in accordance with some embodiments of the disclosure. FIG. 1C show cross-sectional representation taken along line A-A' of FIG. 2.

As shown in FIG. 2, the semiconductor die 120 is located at the center, and four stacked die package structure 130a, 130b are disposed at opposite sides of the semiconductor die 120. Two first stacked die package structures 130a are symmetric to two second stacked die package structures 130b with respect to the semiconductor die 120. The area of the semiconductor die 120 is greater than the area of each of the first stacked die package structures 130a. In some embodiments, a ratio of the area of the first stacked die package structures 130a to the area of the semiconductor die 120 is in a range from about 30% to about 60%.

Figure 3:
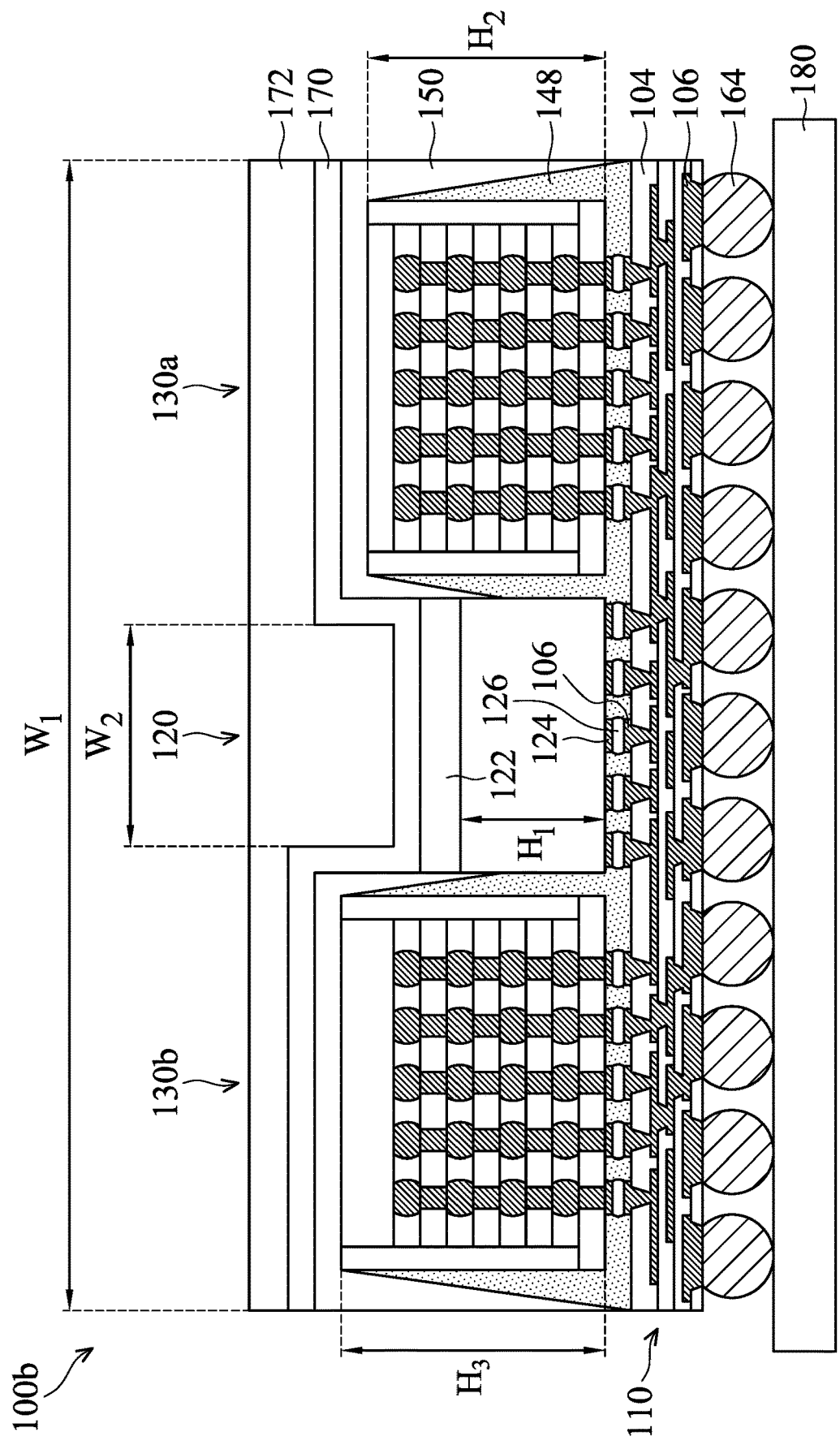
FIG. 3 shows a cross-sectional representation of a package structure, in accordance with some embodiments of the disclosure.

FIG. 3 shows a cross-sectional representation of a package structure 100b, in accordance with some embodiments of the disclosure. The package structure 100b is similar to, or the same as, the package structure 100a shown in FIG. 1I, except that the first stacked die package structure 130a and the second stacked die package structure 130b have different heights. Processes and materials used to form semiconductor device structure 100b may be similar to, or the same as, those used to form the semiconductor device structure 100a and are not repeated herein.

The semiconductor die 120 has the first height $H_1$, the first stacked die package structure 130a has the second height $H_2$, and the second stacked die package structure 130b has the third height $H_3$. The third height $H_3$ is greater than the second height $H_2$, and the second height $H_2$ is greater than the first height $H_1$.

FIGS. 4A-4G show cross-sectional representations of various stages of forming a package structure 100c, in accordance with some embodiments of the disclosure. The package structure 100c is similar to, or the same as, the package structure 100a shown in FIG. 1I, except that the top surface of the first stacked die package structure 130a and the top surface of the second stacked die package structure 130b are in direct contact with the adhesive layer 170.

Figure 4A:
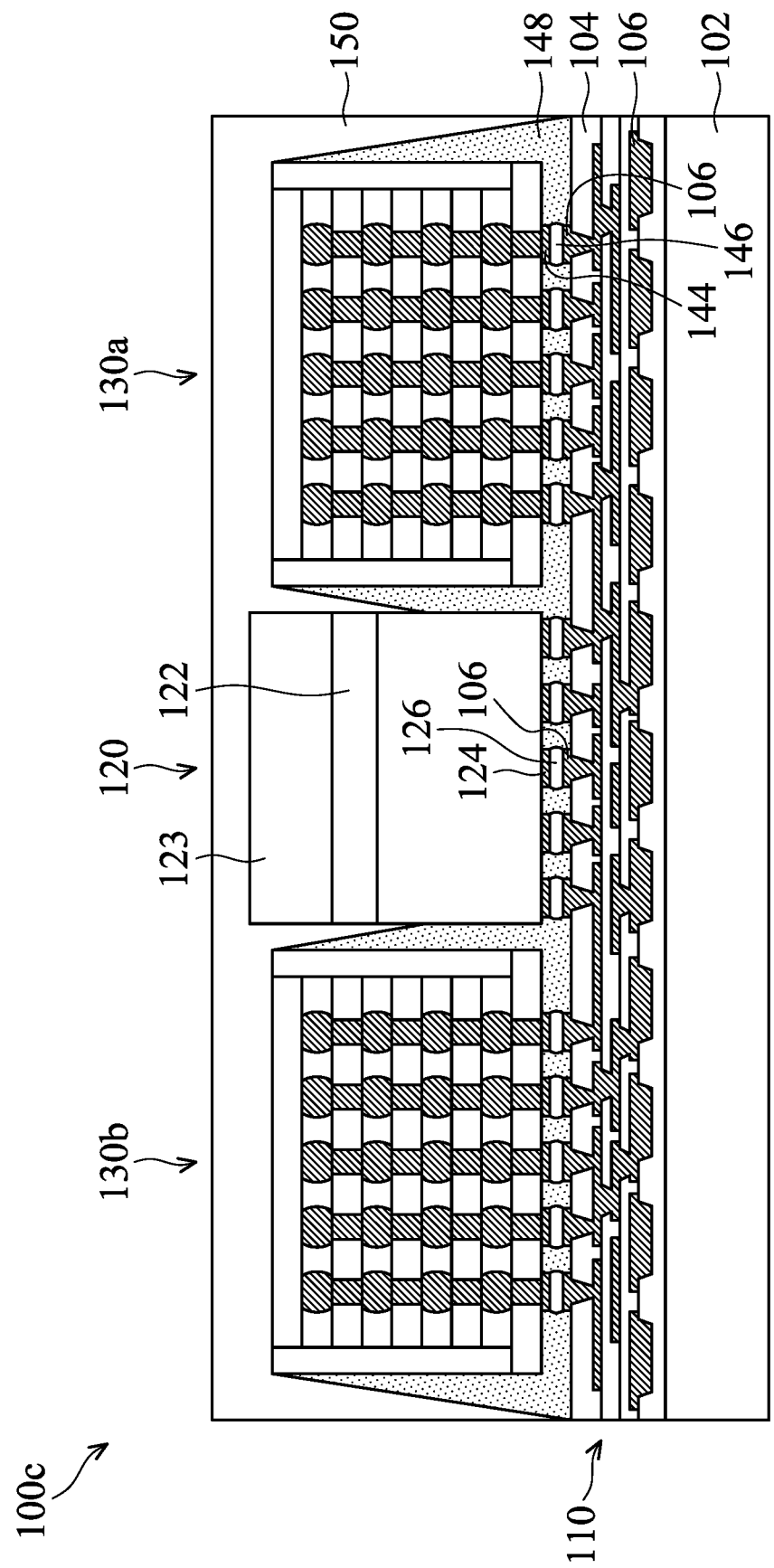
FIGS. 4A-4G show cross-sectional representations of various stages of forming a package structure, in accordance with some embodiments of the disclosure.

As shown in FIG. 4A, the interconnect structure 110 is formed over the substrate 102, and the first stacked die package structure 130a and the second stacked die package structure 130b are disposed over the interconnect structure 110. Each of the first stacked die package structure 130a and the second stacked die package structure 130b includes a number of semiconductor dies 132A, 132B, 132C, 132D stacked on a buffer die (or base die) 131 that performs as a logic circuit.

The underfill layer 148 is formed between the semiconductor die 120, the first stacked die package structure 130a, the second stacked die package structure 130b, and the interconnect structure 110. Next, the package layer 150 is formed over the underfill layer 148.

Figure 4B:
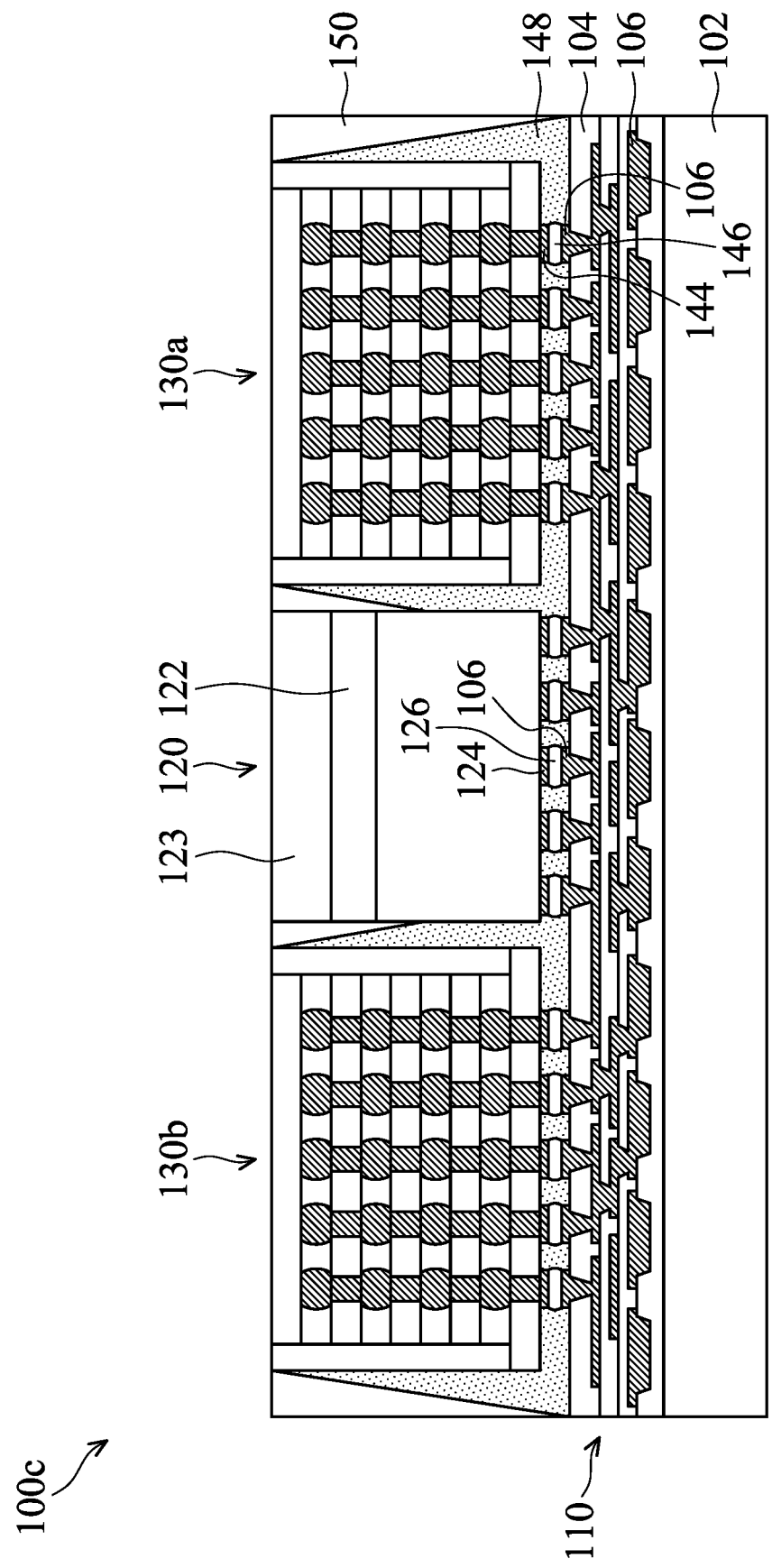

Next, as shown in FIG. 4B, a portion of the removable film 123, a portion of the first stacked die package structure 130a and a portion of the second stacked die package structure 130b are removed, in accordance with some embodiments of the disclosure. As a result, the top surface of the first stacked die package structure 130a and the top surface of the second stacked die package structure 130b are exposed. In some embodiments, the no-functional region is removed, and thus the function of the semiconductor dies 132A, 132B, 132C and 132D are maintained.

Figure 4C:
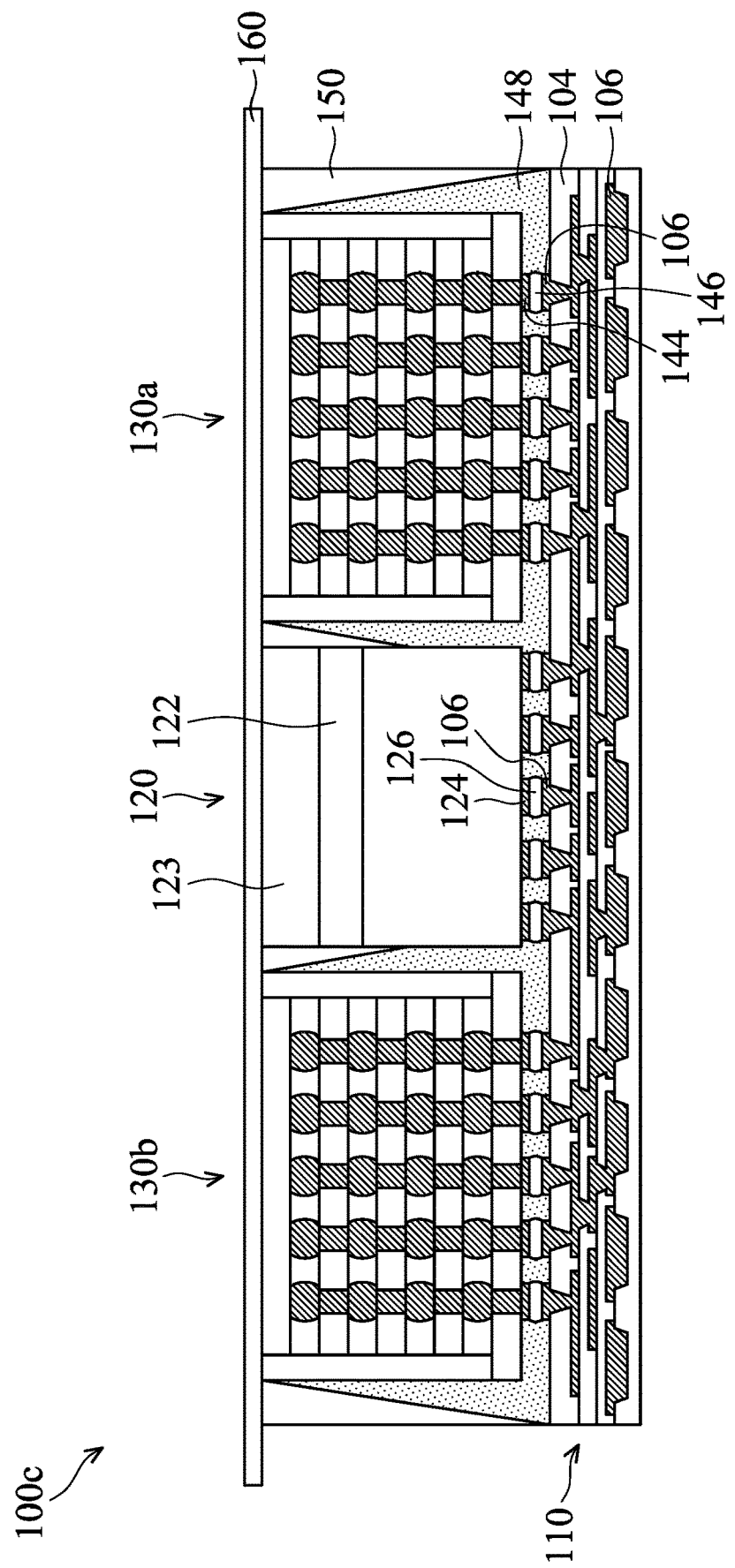

Afterwards, as shown in FIG. 4C, the removable film 123, the exposed top surface of the first stacked die package structure 130a and the exposed top surface of the second stacked die package structure 130b are attached to the frame tape 160, in accordance with some embodiments of the disclosure. Afterwards, the carrier substrate 102 is removed.

Figure 4D:
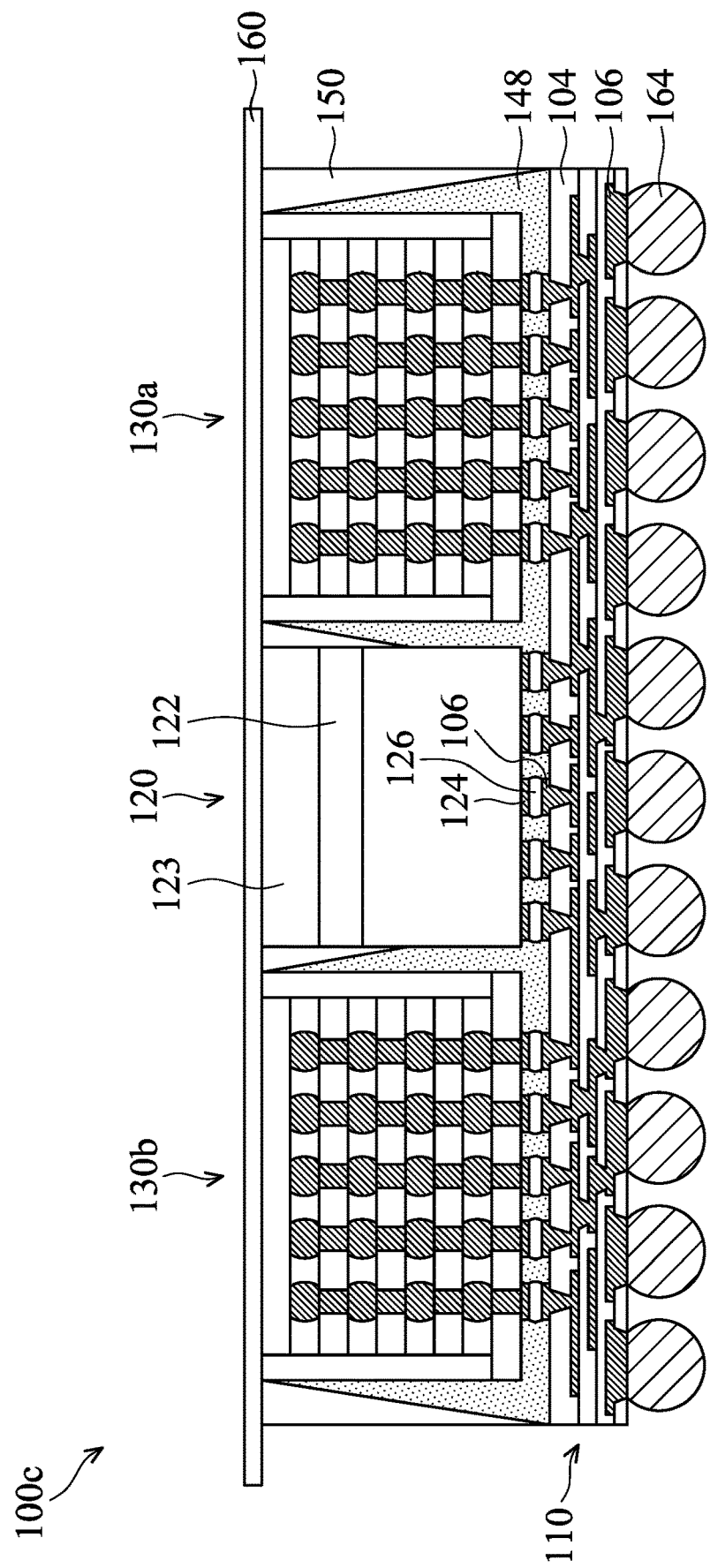

Subsequently, as shown in FIG. 4D, a portion of the interconnect structure 110 is removed to expose the conductive layer 106, in accordance with some embodiments of the disclosure. Next, a number of the conductive connectors 164 are formed over the exposed conductive layer 106 of the interconnect structure 110. The conductive connectors 164 are electrically connected to the conductive layer 106 of the interconnect structure 110. In some embodiments, the conductive connectors 164 are referred to as controlled collapse chip connection (C4) bumps. Subsequently, a singulation process is performed to separate the wafer-level package structure 100a into multiple die-level package structure 100a. In some embodiments, the singulation process is a dicing process.

Figure 4E:
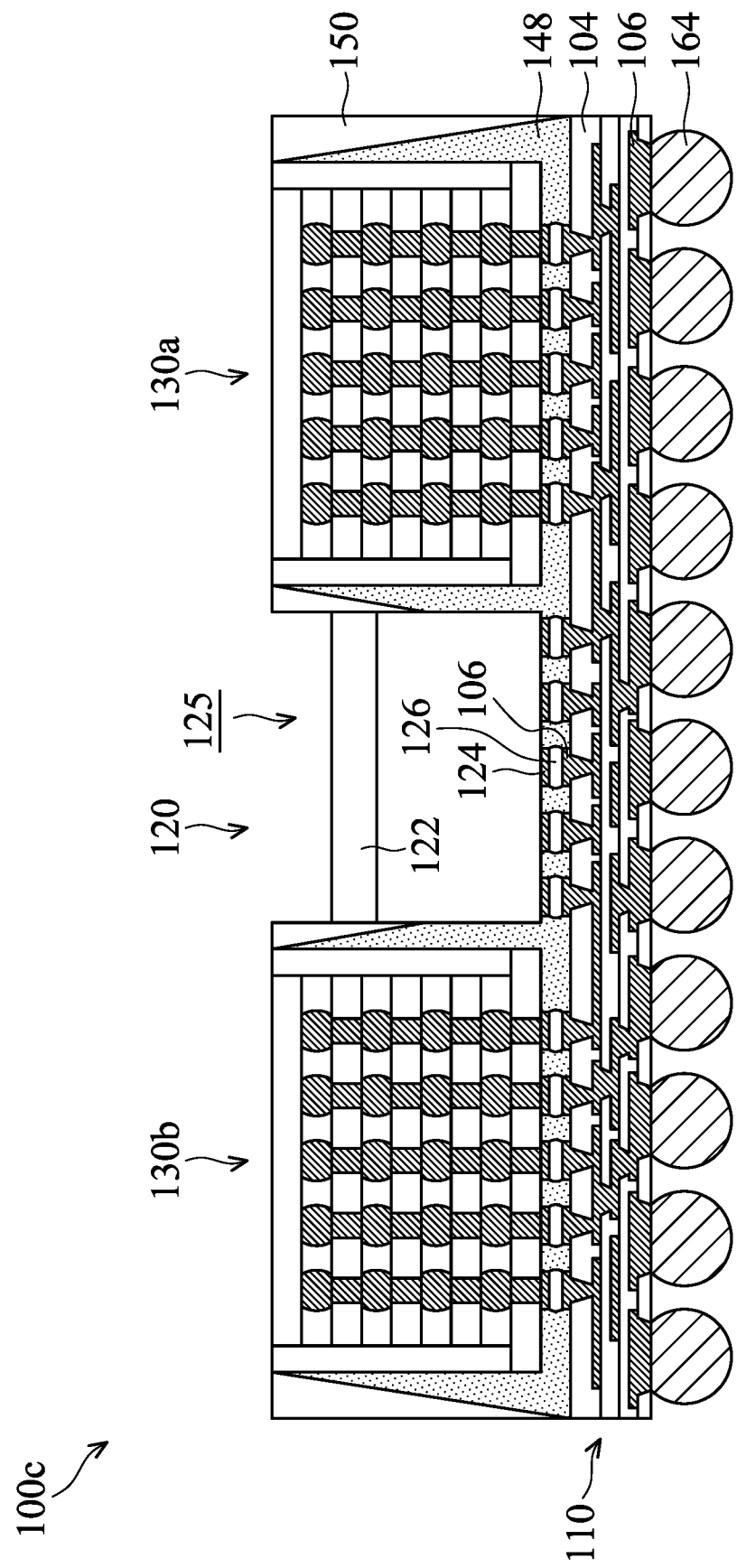

Afterwards, as shown in FIG. 4E, the frame tape 160 is removed, and then the removable film 123 is removed, in accordance with some embodiments of the disclosure. As a result, the recess 125 is formed over the top surface of the semiconductor die 120.

Figure 4F:
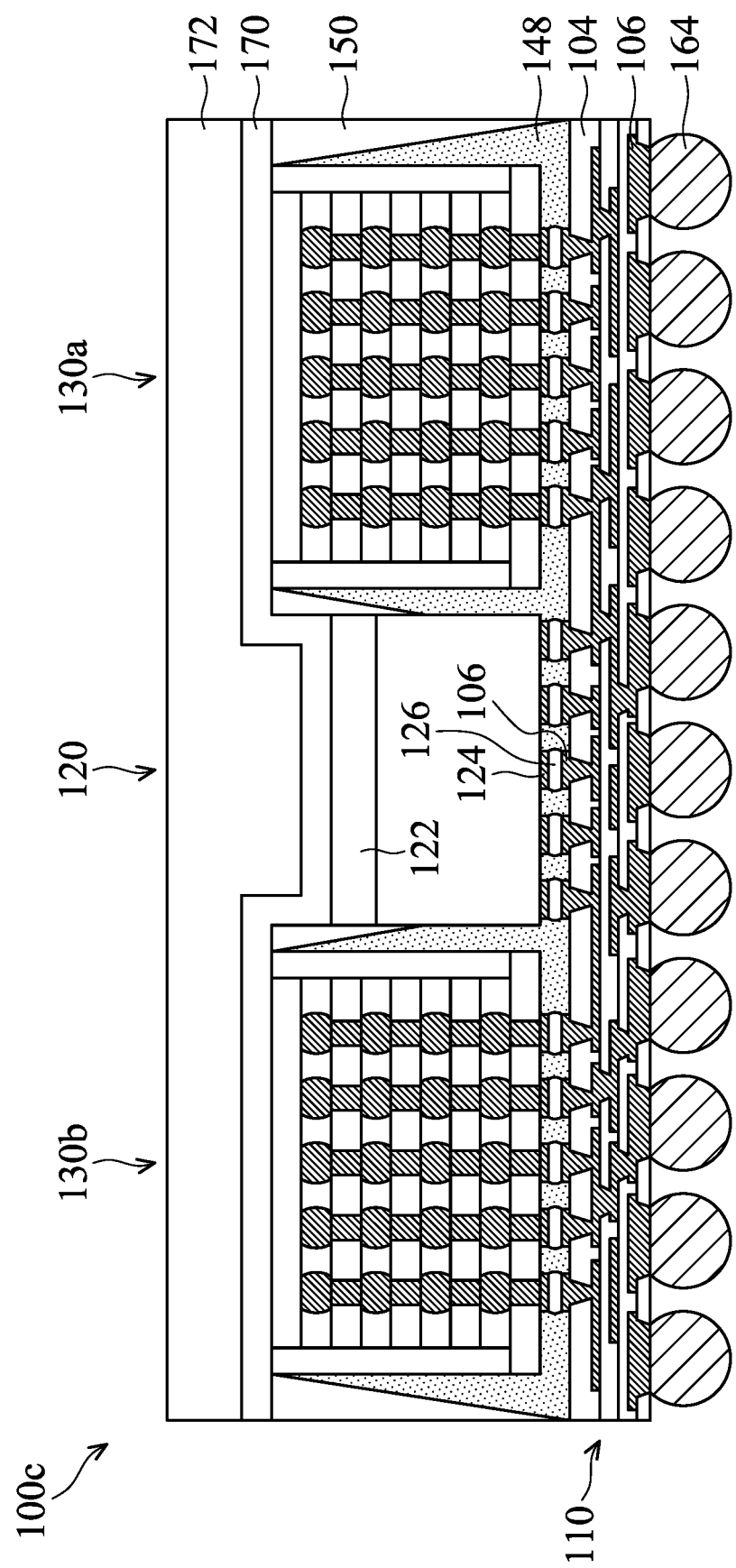

Next, as shown in FIG. 4F, the adhesive layer 170 is formed over the semiconductor die 120 and the package layer 150, in accordance with some embodiments of the disclosure. Afterwards, the lid structure 172 is formed over the adhesive layer 170. The lid structure 172 has the protruding portion 172d directly over the semiconductor die 120 to effectively dissipate the heat.

Figure 4G:
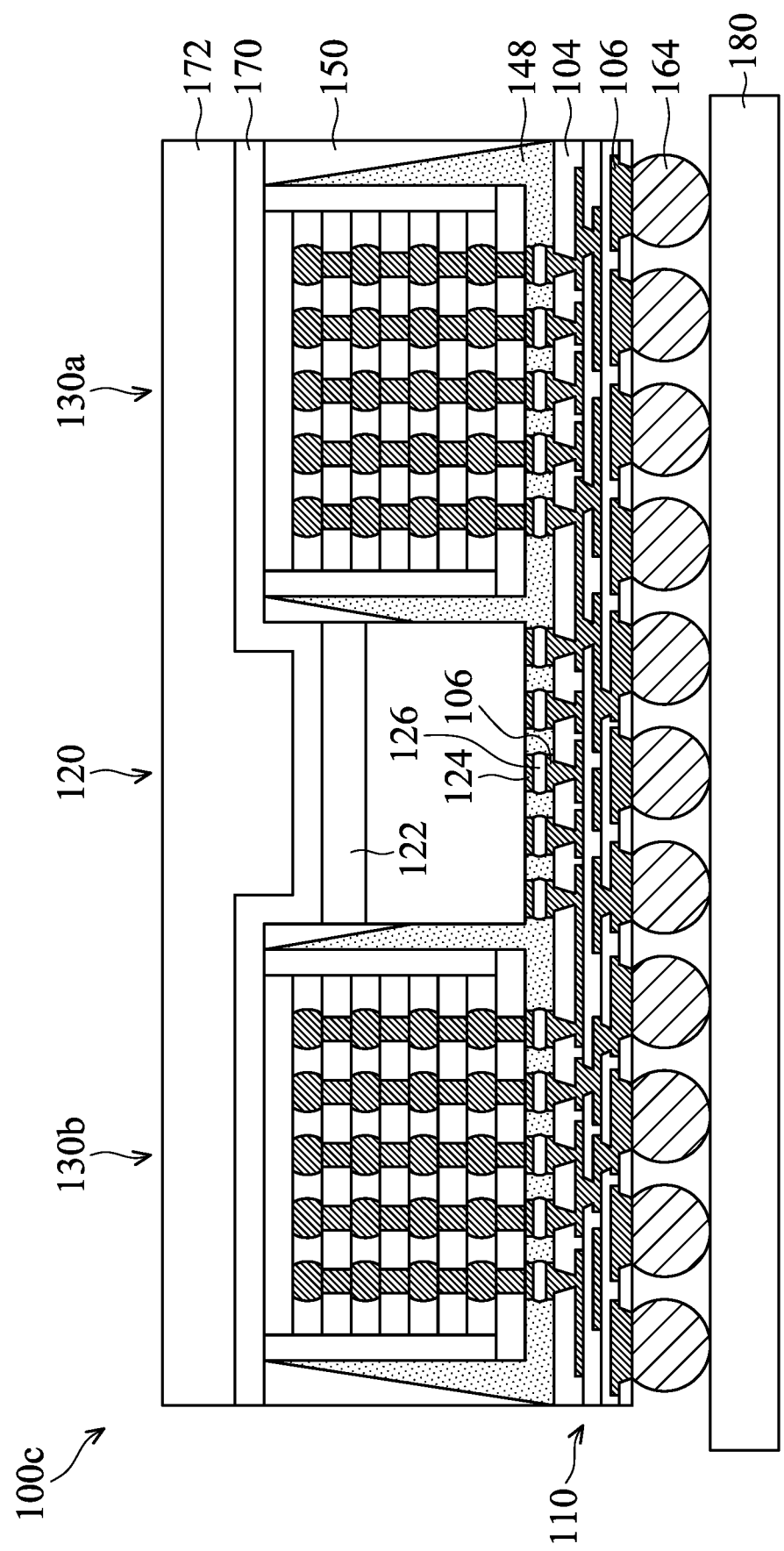

Afterwards, as shown in FIG. 4G, the package structure 100c is bonded to a package substrate 180 through the conductive connectors 164, in accordance with some embodiments. In some embodiments, the package substrate 180 is a printed circuit board (PCB).

The difference between FIG. 4G and FIG. 1I is that no package layer 150 is between the top surface of the first stacked die package structure 130a and the adhesive layer 170 in FIG. 4G, and the first stacked die package structure 130a is in direct contact with the adhesive layer 170. As a result, the heat generated from the first stacked die package structure 130a and the semiconductor die 120 can be directly transfer through the adhesive layer 170 to the lid structure 172. Therefore, the heat dissipation efficiency is improved. The package structure 100c can be applied to a high power device due to the advantage of high dissipation efficiency.

Embodiments for forming a package structure and method for formation the same are provided. The package structure includes an interconnect structure, and a semiconductor die and a stacked die package structure formed over the interconnect structure. The stacked die package structure includes multiple semiconductor dies. The height of the stacked die package structure is higher than that of the semiconductor die. In order to compensate the height difference, a removable film is temporarily formed directly over the semiconductor die, and then is removed to form a recess. In order to maintain the high heat dissipation, a lid structure with a protruding portion corresponding to the recess is designed. Therefore, the heat is efficiently dissipated by the lid structure and the performance of the package structure is improved.

A method for forming a package structure is provided in some embodiments. The method includes disposing a semiconductor die over a carrier substrate, wherein a removable film is formed over the semiconductor die, disposing a first stacked die package structure over the carrier substrate, wherein a top surface of the removable film is higher than a top surface of the first stacked die package structure, and removing the removable film to expose a top surface of the semiconductor die, wherein a top surface of the semiconductor die is lower than the top surface of the first stacked die package structure.

A method for forming a package structure is provided in some embodiments. The method includes disposing a semiconductor die over an interconnect structure, disposing a first stacked die package structure over the interconnect structure, forming an underfill layer continuously below the semiconductor die and the first stacked die package structure, wherein the underfill layer covers sidewalls of the semiconductor die and the first stacked die package structure, forming a package layer between the semiconductor die and the first stacked die package structure and over the semiconductor die and the first stacked die package structure, and exposing a top surface of the semiconductor die which is lower than a top surface of the package layer, wherein the first stacked die package structure is covered by the package layer after the top surface of the semiconductor die is exposed.

A package structure is provided in some embodiments. The package structure includes an interconnect structure, a semiconductor die disposed over the interconnect structure, a first stacked die package structure disposed over the interconnect structure, a second stacked die package structure disposed over an interconnect structure, wherein the semiconductor die is between the first stacked die package structure and the second stacked die package structure, and the semiconductor die is lower than the first stacked die package structure and the second stacked die package structure, and a package layer surrounding the first stacked die package structure and the second stacked die package structure, wherein the semiconductor die is exposed from the package layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a package structure, comprising:
    disposing a semiconductor die over a carrier substrate, wherein a removable film is formed over the semiconductor die;
    disposing a first stacked die package structure over the carrier substrate, wherein a top surface of the removable film is higher than a top surface of the first stacked die package structure; and
    removing the removable film to expose a top surface of the semiconductor die, wherein a top surface of the semiconductor die is lower than the top surface of the first stacked die package structure.

2. The method as claimed in claim 1, further comprising forming an adhesive film over the semiconductor die and the first stacked die package structure, wherein the adhesive film partially overlaps the first stacked die package structure in a direction parallel to the carrier substrate.

3. The method as claimed in claim 2, wherein the adhesive film is in direct contact with the semiconductor die.

4. The method as claimed in claim 1, further comprising disposing a lid structure over the semiconductor die and the first stacked die package structure, wherein the lid structure comprises a protruding portion partially overlaps the first stacked die package structure in a direction parallel to the carrier substrate.

5. The method as claimed in claim 4, further comprising disposing a second stacked die package structure over the carrier substrate, wherein the protruding portion is between the first stacked die package structure and the second stacked die package structure.

6. The method as claimed in claim 5, wherein the protruding portion is over the semiconductor die.

7. The method as claimed in claim 4, further comprising forming an underfill layer below the semiconductor die and the first stacked die package structure, wherein the protruding portion is partially surrounded by the underfill layer.

8. A method for forming a package structure, comprising:
    disposing a semiconductor die over an interconnect structure;
    disposing a first stacked die package structure over the interconnect structure;
    forming an underfill layer continuously below the semiconductor die and the first stacked die package structure, wherein the underfill layer covers sidewalls of the semiconductor die and the first stacked die package structure;
    forming a package layer between the semiconductor die and the first stacked die package structure and over the semiconductor die and the first stacked die package structure; and
    exposing a top surface of the semiconductor die which is lower than a top surface of the package layer, wherein the first stacked die package structure is covered by the package layer after the top surface of the semiconductor die is exposed.

9. The method as claimed in claim 8, further comprising forming an underfill layer between the semiconductor die and the first stacked die package structure, wherein the package layer and a sidewall of the first stacked die package structure are separated by the underfill layer.

10. The method as claimed in claim 9, wherein a sidewall of the semiconductor die is partially in contact with the package layer.

11. The method as claimed in claim 8, further comprising forming an adhesive layer in contact with the top surface of the semiconductor die, wherein the adhesive layer and the first stacked die package structure are separated by the package layer.

12. The method as claimed in claim 8, further comprising:
    disposing a second stacked die package structure over the interconnect structure; and
    disposing a lid structure over the semiconductor die, the first stacked die package structure, and the second stacked die package structure, wherein the lid structure comprises a main portion and a protruding portion extending from the main portion and between the first stacked die package structure and the second stacked die package structure.

13. The method as claimed in claim 12, wherein a sidewall of the package layer is exposed from the lid structure.

14. The method as claimed in claim 12, wherein a width of the protruding portion is less a width of the semiconductor die.

15. The method as claimed in claim 8, further comprising forming conductive connectors on the interconnect structure, wherein the conductive connectors and the semiconductor die are disposed on opposite sides of the interconnect structure.

16. A method for forming a package structure, comprising:
    bonding a semiconductor die over an interconnect structure;
    bonding a first stacked die package structure over the interconnect structure;
    bonding a second stacked die package structure over an interconnect structure, wherein the semiconductor die is between the first stacked die package structure and the second stacked die package structure, and the semiconductor die is lower than the first stacked die package structure and the second stacked die package structure; and
    forming a package layer to surround the first stacked die package structure and the second stacked die package structure, wherein the semiconductor die is exposed from the package layer.

17. The method as claimed in claim 16, wherein top surfaces of the first stacked die package structure and the second stacked die package structure are in contact with the package layer.

18. The method as claimed in claim 17, further comprising applying an adhesive layer over the first stacked die package structure and the second stacked die package structure, wherein the adhesive layer is separated from the first stacked die package structure and the second stacked die package structure.

19. The method as claimed in claim 16, wherein top surfaces of the first stacked die package structure and the second stacked die package structure are exposed from the package layer.

20. The method as claimed in claim 19, further comprising applying an adhesive layer over the first stacked die package structure and the second stacked die package structure, wherein the adhesive layer is in contact with the top surfaces the first stacked die package structure and the second stacked die package structure.

* * * * *